(12) United States Patent
Boudreaux et al.

(10) Patent No.: US 7,450,400 B2
(45) Date of Patent: Nov. 11, 2008

(54) ELECTRONIC SYSTEM AND METHOD

(75) Inventors: Brent Boudreaux, Highland Village, TX (US); Eric Peterson, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 350 days.

(21) Appl. No.: 11/007,095

(22) Filed: Dec. 8, 2004

(65) Prior Publication Data

US 2006/0120060 A1 Jun. 8, 2006

(51) Int. Cl.
*H05K 7/02* (2006.01)
*H05K 7/04* (2006.01)

(52) U.S. Cl. .................... 361/809; 361/810

(58) Field of Classification Search ............. 361/810, 361/807, 709, 792
See application file for complete search history.

(56) References Cited

U.S. PATENT DOCUMENTS

| | | | |
|---|---|---|---|
| 4,768,973 A * | 9/1988 | Bakermans | 439/331 |
| 4,819,713 A | 4/1989 | Weisman | |
| 4,824,303 A * | 4/1989 | Dinger | 411/79 |
| 4,856,151 A | 8/1989 | Fujimoto | |
| 5,719,443 A | 2/1998 | Messina | |
| 5,786,989 A | 7/1998 | Kawabe | |
| 6,046,905 A | 4/2000 | Nelson et al. | |
| 6,160,706 A | 12/2000 | Davis et al. | |
| 6,166,908 A * | 12/2000 | Samaras et al. | 361/700 |
| 6,208,527 B1 | 3/2001 | McMahon et al. | |
| 6,269,863 B1 | 8/2001 | Wyler | |
| 6,377,463 B1 | 4/2002 | Shah | |
| 6,381,136 B1 | 4/2002 | Nelson et al. | |
| 6,473,305 B1 * | 10/2002 | Gordon et al. | 361/704 |
| 6,493,233 B1 | 12/2002 | De Lorenzo et al. | |
| 6,542,372 B1 | 4/2003 | Paquin et al. | |
| 6,549,410 B1 | 4/2003 | Cohen | |
| 6,693,751 B2 | 2/2004 | Moril et al. | |
| 6,801,431 B2 * | 10/2004 | Hartke et al. | 361/704 |
| 6,968,889 B2 * | 11/2005 | Wang et al. | 165/80.1 |
| 7,197,806 B2 * | 4/2007 | Boudreaux et al. | 29/434 |
| 2001/0040795 A1 * | 11/2001 | Mccutchan et al. | 361/752 |
| 2002/0176233 A1 | 11/2002 | Evans | |
| 2003/0119357 A1 | 6/2003 | Lin et al. | |
| 2003/0142485 A1 | 7/2003 | Szu | |
| 2003/0210532 A1 | 11/2003 | Le et al. | |
| 2004/0100777 A1 | 5/2004 | Lee | |

OTHER PUBLICATIONS

Rubenstein et al., U.S. Appl. No. 10/919,998, filed Aug. 17, 2004 (Related Application).

(Continued)

*Primary Examiner*—Hung S Bui (57) ABSTRACT

Various embodiments of an electronic system and method for assembling an electronic system are provided. The electronic system includes an electronic module that is in physical communication with a printed circuit board along a connection area, and the proximal portion and the distal portion of the electronic module, located beyond the connection area, are elevated above the printed circuit board. The electronic system further includes a plurality of securing devices of the proximal portion of the electronic module and at least one securing device that extends through at least one opening of the distal portion of the electronic module to secure the proximal and distal portions of the electronic module to the printed circuit board.

19 Claims, 5 Drawing Sheets

OTHER PUBLICATIONS

Brent Boudreaux et al., U.S. Appl. No. 10/365,243, filed Feb. 12, 2003 (Related Application).
Hewlett-Packard Company, Breakthrough Innovation Scales Standards-based HP Integrity Servers to 128 Processors, Delivering Greater Value to Customers, May 5, 2004.
Calmark Corporation, series 225—"card-lok" retainer (cold Plate) Internet, www.calmark.com, date unknown.

* cited by examiner

ELECTRONIC SYSTEM AND METHOD

CROSS REFERENCE TO RELATED APPLICATIONS

This application is related to U.S. Utility patent application Ser. No. 10/365,243 entitled "FASTENER FOR VARIABLE MOUNTING" filed on Feb. 12, 2003, and U.S. Utility patent application Ser. No. 10/919,998 entitled "SECURABLE ELECTRONIC MODULE" filed on Aug. 17, 2004.

BACKGROUND

Electronic modules which are attached to a printed circuit board (PCB) to make up electronic systems are used in many applications. One type of electronic module attached or connected to a printed circuit board may include electronic packages or modules, such as processor modules, chips and the like. For example, electronic modules may be mounted to the printed circuit board using one of several types of connector systems disposed between the electronic module and the printed circuit board. Some electronic modules may be large relative to the size of the connector system and may extend well beyond the area of connection, thereby resulting in a large area of the electronic module being unsupported above the printed circuit board. The unsupported portions of the electronic module may move or vibrate when force is applied to the electronic module, for example, during movement of the electronic system. The movement may cause the connection between the electronic module and the printed circuit board to become weakened or damaged when it is off balance. This problem becomes more likely when the electronic module is mounted at a location removed from its center of gravity.

BRIEF DESCRIPTION OF THE DRAWINGS

The following example embodiments of the present invention can be understood with reference to the following drawings. The components in the drawings are not necessarily to scale. Also, in the drawings, like reference numerals designate corresponding parts throughout the several views.

DETAILED DESCRIPTION

Figure 1:
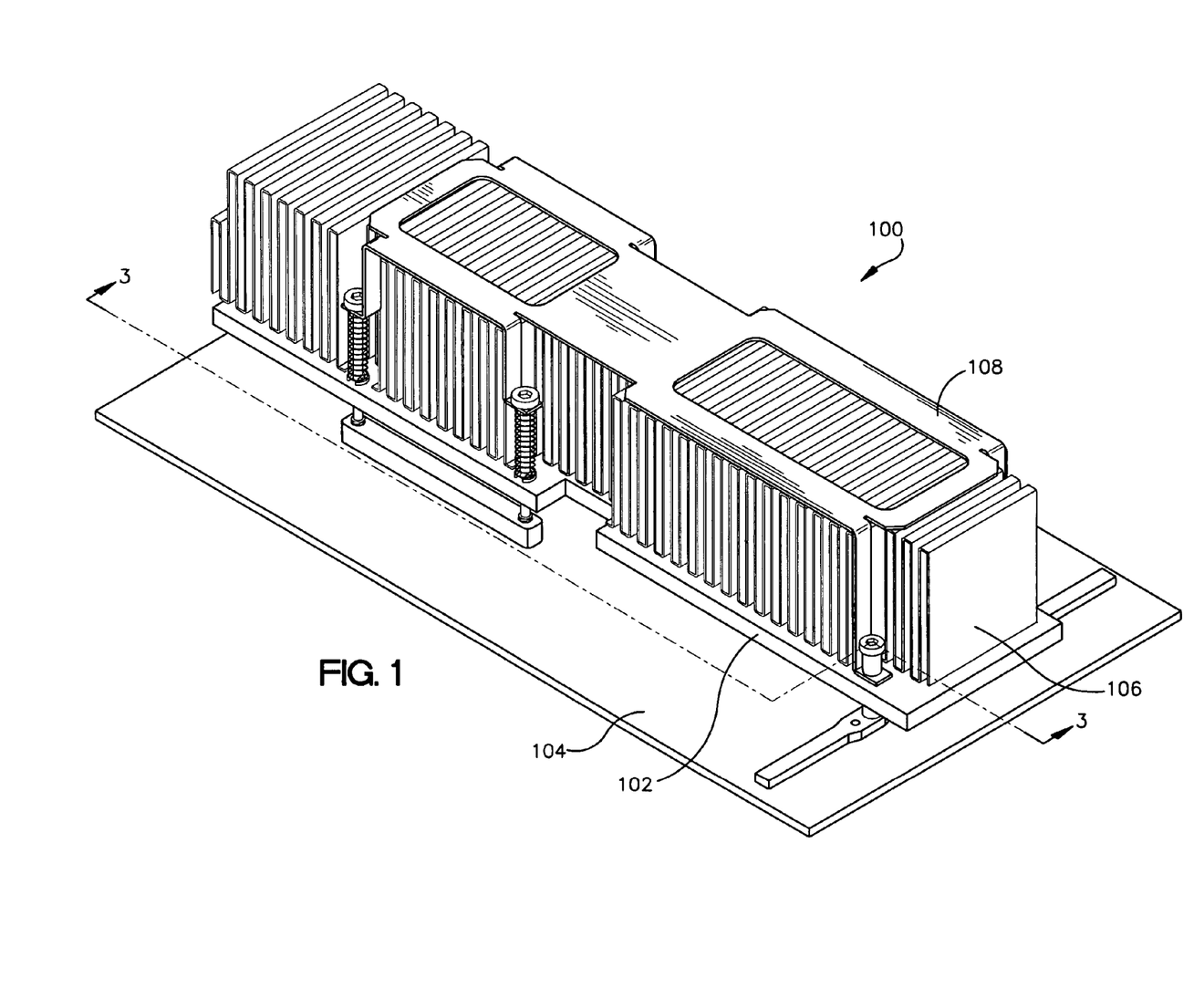
FIG. 1 is a top perspective view of an electronic system in which an electronic module is attached to a printed circuit board, according to an embodiment of the invention.

FIG. 1 is a schematic illustration showing a perspective top view of an electronic system 100 according to an embodiment of the invention. The electronic system can be utilized in a computer, server, or one of several electronic devices containing electrical components. The electronic system 100 includes an electronic module 102 attached to printed circuit board 104, and optionally, a heat sink 106 disposed on the electronic module 102 and a frame 108 disposed on the heat sink 106 and attached to the electronic module 102.

The "electronic module" 102 as used herein describes a physical logic device that includes one or more components and one or more layers. Each layer may contain, but is not limited to, one or more microprocessors, application specific integrated circuits (ASIC), analog circuits, digital circuits, programmed logic devices, memory devices, chips, for example. An electronic module that includes one or more microprocessors may also be referred to, for example, as a processor module. One example electronic module is manufactured by Hewlett-Packard Company available under the product name MX2 which includes multiple Intel® itanium®2 processors.

Figure 2:
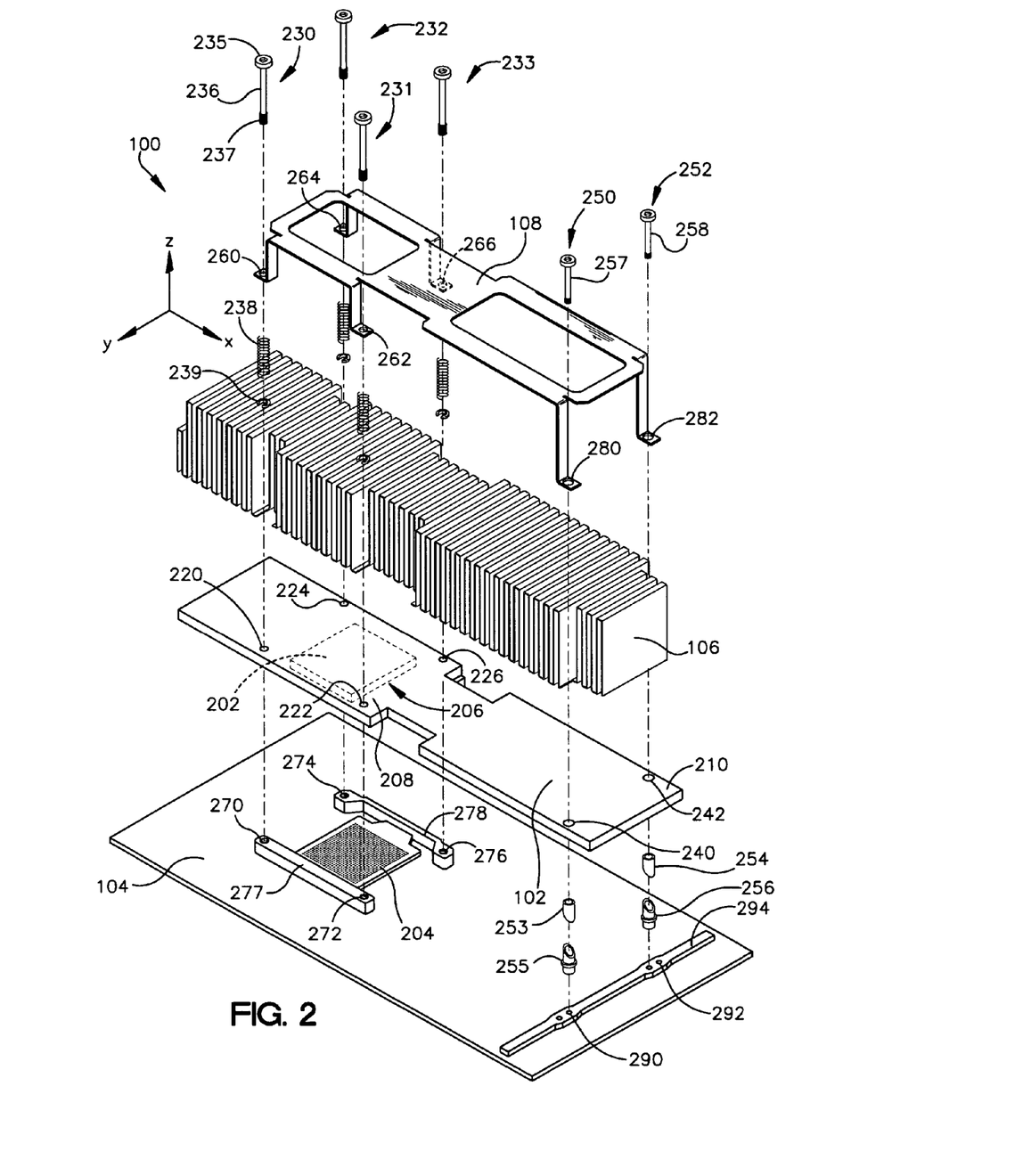
FIG. 2 is an exploded top view of the electronic system of FIG. 1, according to an embodiment of the invention.

FIG. 2 shows an exploded perspective top view of the electronic system 100. The electronic system 100 can include a connector 202 (shown in phantom) that is attached to or integral with the electronic module 102 and that can attach to a receptor 204 of the printed circuit board 104 which can be integral with the printed circuit board 104 or can be a separate component attached thereto. For example, the electronic module 102 can be connected to the printed circuit board 104 via a connector 202 that is a pin connector to mate with a receptor 204 that is a socket soldered to the printed circuit board 104. Alternatively, the connection between the printed circuit board 104 and the electronic module 102 may be fixed, such as, for example, by a soldered connection between the electronic module 102 and the printed circuit board 104. Other types of connectors may also be used.

The connector 202 defines the area of connection 206. As used herein, the "area of connection" 206 refers to the cross section of the electronic module of which its surface along the x-y plane is in physical communication with the connector 202. As shown in FIGS. 1 and 2, the electronic system 100 can have an electronic module 102 that is relatively long in length along an axis, for example along the x-axis, compared to the length of the area of connection 206 along the same axis. Beyond the area of connection 206, the electronic module 102 has a proximal portion 208 and a distal portion 210, the proximal portion 208 being closer in proximity to the area of connection 206 than the distal portion 210 which is remote from the area of connection 206.

To further reinforce the connection between the electronic module 102 and the printed circuit board 104, the proximal portion 208 of the electronic module 102 includes a plurality of openings, for example openings 220, 222, 224 and 226, configured to receive a plurality of securing devices 230, 231, 232, and 233, respectively. The plurality of securing devices which connect the proximal portion 208 of the electronic module 100 to the printed circuit board 104 can help prevent loosening or detachment of the connection during movement of the electronic system 100. The reinforcement is particularly helpful if the connection is delicate, or easily susceptible to damage, for example, when the receptor 204 is a socket that is joined to the electronic module 02 with a soldered connection of a ball grid array (BGA).

To reduce potential movement of the distal portion 210 of the electronic module 104, the distal portion 210 includes at least one opening, for example openings 240 and 242, configured to receive at least one securing device, for example securing device 250 and 252, that respectively can connect the distal portion 210 of the electronic module 102 to the printed circuit board 104.

Therefore, the distance between the area of connection 206 and each one of the plurality of the openings 230, 231, 232, 233 of the proximal portion 208 is less than the distance between the area of connection 206 and the at least one opening 240, 242 of the distal portion 210. In the example embodiment shown, the distance between the openings 220, 222, 224, 226 of the proximal portion 208 and openings 240, 242 of the distal portion 210 can be much greater than the distance between the openings 220, 222, 224, 226 of the proximal portion 208 and the area of connection 206.

Securing devices 230, 231, 232, 233, can be inserted through tab openings 260, 262, 264, 266 of the frame 108, through the openings 220, 222, 224, 226 of the proximal portion 208 of the electronic module 102 and into receptors 270, 272, 274, 276 to secure electronic module 102 to the printed circuit board 104. In this illustrated example, securing devices 230, 231, 232, 233, engage receptors 270, 272, 274, 276 which are shown mounted onto the printed circuit board 104 as separate components, for example receptors of mounting hardware 277, 278, which is attached to the printed circuit board 104. Securing devices 230, 231, 232, 233 may be threaded to engage threads of the mounting hardware 277, 278 or they may be snap fitted into a mating component of the mounting hardware. Alternatively, devices 230, 231, 232, 233 can engage the printed circuit board 104 directly. The securing devices 230, 231, 232, 233 can be threaded to engage the receptors 270, 272, 274, 276, and alternatively, to a nut (not shown) positioned within receptors 270, 272, 274, 276

The securing devices 250, 253 can be inserted through tab openings 280, 282 of frame 108 and through the openings 240, 242 of the distal portion 210 of the electronic module 102 and into receptors 290, 292 to secure the electronic module 102 to the printed circuit board 104. Securing devices 250, 252 engage receptors 290, 292 which may be part of mounting hardware 294, or a recessed nut, or the receptors may be integral with the printed circuit board 104, for example.

The number of securing devices positioned along the proximal portion 208 of the electronic module 100 can vary. For example, FIG. 2 shows that four securing devices 230, 231, 232, 233 are positioned symmetrically about connector 202, however, two, three, or more securing devices can be used to secure the proximal portion 208 of the electronic module 102 to the printed circuit board 104. The connector 202 can be centered with respect to the securing devices so that approximately equal force is applied to the connector 202 when the securing devices are engaged to secure the electronic module 102 in place.

For example, when electronic module 102 is positioned as desired so that connector 202 mates with receptor 204 of the printed circuit board 104, the securing devices 230, 231, 232, and 233 disposed in openings 220, 222, 224 226, along the proximal portion 208 of the electronic module 102, can be sequentially engaged in an alternating fashion to interface with the receptors 270, 272, 274, and 276, respectively, of the printed circuit board 104. This secures electronic module 102 to the circuit board 104 along the proximal portion 208 of the electronic module 102 after which the height of the electronic module 102 or the distance along the z-axis, between the distal portion 210 of the electronic module 102 and the printed circuit board 104 can be set. The distal portion 210 of the electronic module can then be locked into position along the z-axis, and the electronic module 102 can be less susceptible to movement relative to the printed circuit board 104, and is more likely to maintain the integrity of the connection between connector 202 and receptor 204.

As shown, one type of suitable securing devices 230, 231, 232, 233 that can be used to secure the proximal portion 208 of the electronic module includes, but is not limited to, spring screws. Securing devices 230, 231, 232, and 233 which are spring screws, for example, include a head 235 and a stem 236 having a threaded portion 237 along the lower portion of the stem 236 for engagement with the printed circuit board 104. The spring screw also includes a spring 238 and a locking ring 239 to support the spring 238. The spring screws can apply resistance against over-tightening and can also ensure that the proper load is applied to the connector 202 and receptor 204 to maintain connection and to reduce or eliminate the likelihood of damage or degradation of the connection, for example, via a solder joint of a BGA between a socket receptor 204, and the printed circuit board 102.

The securing devices 250, 252 along the distal portion 210 of the electronic device can be engaged to lock the electronic module 102 in place along the z-axis while applying little or no force on the electronic module along the z-axis. A securing device that can be used to secure the distal portion 210 of the electronic device 102 can include, but is not limited to, a wedge-lock assembly and a double-threaded fastener assembly.

In one embodiment, securing devices 250, 252 as shown in FIG. 2 are wedge-lock assemblies which include first wedge portions 253, 254, second wedge portions 255, 256, and fasteners 257, 258, respectively. Securing devices 250, 252 can engage, directly or indirectly, the distal portion 210 of the electronic module 102 in a locked position via application of a transverse force against a wall of at least one opening, for example openings 240, 242, of the distal portion of the electronic module 102 as will be described in greater detail below. However, it can be appreciated that other types of securing devices which eliminate or control movement of the electronic module 102 relative to the printed circuit board 104 within an acceptable tolerance of the electronic module 102 to the printed circuit board 104 can be used. An acceptable tolerance would be known by one of ordinary skill in the art and depends upon the particular application, for example the specific electronic system 100. That is, the tolerance does not allow bowing or bending of the electronic module 102 or undue stress, or any combination thereof, so as to result in damage or degradation to the mechanical or electrical connection between the electronic module 102 and the printed circuit board 104.

Figure 3:
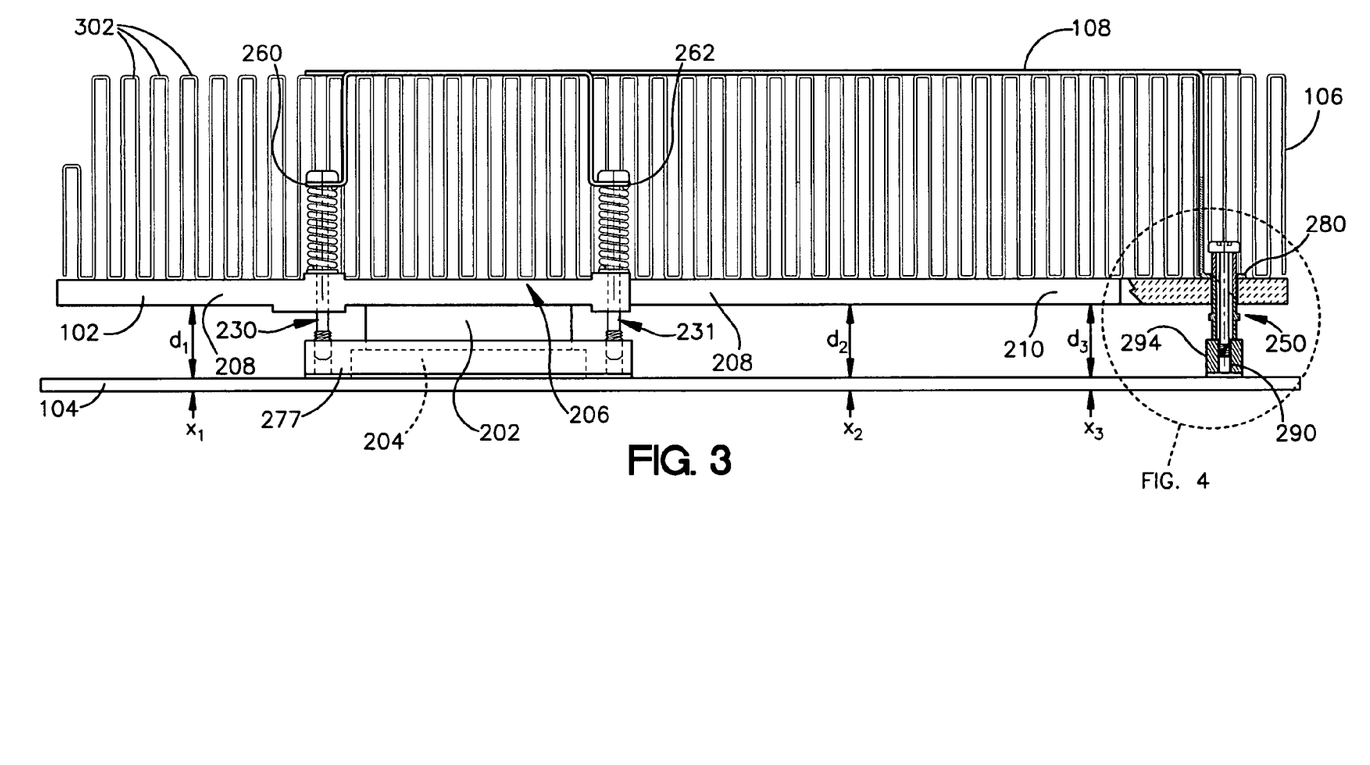
FIG. 3 is a cross-sectional view of the electronic system of FIG. 1 taken along lines 3-3, according to an embodiment of the invention.

Referring to FIG. 3 is a cross-sectional view of the electronic system 100 of FIG. 1 taken along lines 3-3. The electronic module 102 is in physical communication with connector 202 which provides for connection with the receptor 204 (in phantom) of the electronic module 102 to printed circuit board 104. As such, the connection area 206 is relatively stable due to the attachment of the connector 202 to the printed circuit board 104, and the proximal portion 208 and distal portion 210 of the electronic module 102 are elevated above the printed circuit board 104.

The electronic module 102 may be spaced at different distances from the printed circuit board 104 along the length of the board 104. The variations in elevation may be caused by unit to unit variations in component tolerances and manufacturing methods. The electronic module 102 can be suspended from the printed circuit board by a distance $d_1$ at a location $x_1$, a distance $d_2$ at location $x_2$, and yet can be suspended from the printed circuit board by a distance $d_3$ at location $x_3$ where the distances $d_1$, $d_2$ and $d_3$ are distinct and can vary from unit to unit. For example, by uneven application of solder used to attach the socket receptor 204 on the board 104 may cause the electronic module 102 to lie at an angle and not be parallel relative to the printed circuit board 104. When the connector 202 is at a location along the electronic module 102 remote from its center of gravity, the distal portion 210 of the electronic module 102 may be more susceptible to cantilevered motion which can apply stress to the connection between the electronic module 102 and the printed circuit board 104.

As referenced above, the electronic system 100 can include a heat sink 106 having a plurality of fins 302 to provide a large surface area to dissipate heat generated by the electronic module 102. The heat sink 106 can be attached to the electronic module 102 mechanically for example, with the use of screws, spring clips, for example, or the heat sink 106 can be chemically bonded using a thermal epoxy, for example. The heat sink 106 can also be integral with the electronic module 102 rather than separately attached.

As shown in FIGS. 1-3, the electronic system 100 can also include frame 108. The securing devices, for example securing devices 230, 231, and 250, are retained by tabs openings 260, 262, and 280, respectively, of frame 108 to allow adjustment for position of one or more securing devices prior to securing them in place. The tabs openings 260, 262, 280 of frame 108 can provide flat surfaces for the heads of securing devices, for example head 235 (FIG. 2) of securing device 230, to seat against.

Figure 4:
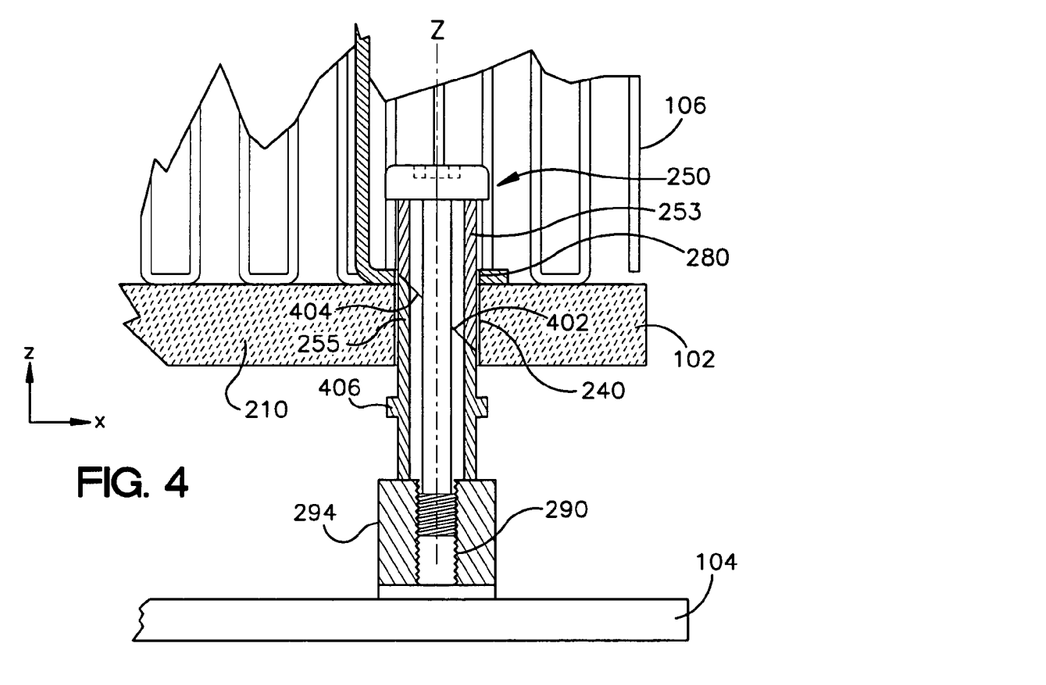
FIG. 4 is a partial cutaway view of the dotted portion of the electronic system shown in FIG. 3 showing a close up view of a securing device according to an embodiment of the invention.

Referring to FIG. 4 is a cross-sectional enlarged view of the circled area of the electronic system 100 of FIG. 3. Securing device 250 is shown extended through opening 240 of the electronic module 100. Securing device 250 located along the distal end 210 of the electronic module 100 includes a first wedge portion 253 having an angled surface 402, a second wedge portion having an angled surface 404 and a fastener 257 extending through the first wedge portion 253 and the second wedge portion 255, such that the angled surface 402 of the first wedge portion 253 and the angled end 404 of the second wedge portion 255 are interfaced when the fastener 257 is extended through the first wedge portion 253 and the second wedge portion 255. A portion of the fastener 257 protrudes from the second wedge 255 portion to interface with the printed circuit board 104.

The securing device 250 can be moveable or can float within the opening 240, as for example, when the diameter of at least a portion of the first wedge portion 253 and the second wedge portion 255 of securing device 250 is less than the diameter of opening 240. That is, the securing device 250 may have side to side movement and up and down movement within the opening 240 of the electronic module 102. The movement provides for increased tolerances for the securing device 250 to engage with the circuit board 104. The additional space for movement of the securing device 250 allows for unit to unit variations in the spacing between the electronic module 102 and the circuit board 104, for example, such as variations in the angle of the electronic module relative to the circuit board, and possibly horizontal misalignment of the opening 240 of the electronic device 102 with the receptor 290, for example, of the mounting hardware 294 on the circuit board 104.

In addition, the distal portion 210 of the electronic module 100 includes opening 240, through which at least a portion of the securing device extends in size so that when the securing device 250 is not engaged, it is free to slide along the axis of connection, for example, along the z-axis prior to positioning the securing device 250 into a fixed location, for example, into receptor 290. Fastener 257 of the securing device 250 is sufficiently sized to extend through the length of the opening 240. The head of fastener 257 and flange 406 of the second wedge portion 255 prevents securing device 250 from passing through the opening 240. The securing device 250 may be adjusted longitudinally until a desired position relative to the printed circuit board is achieved, and thereafter, the first and second wedge portions 253, 255 may be drawn together causing its angled surfaces 402, 404 to move in opposite directions laterally, for example, along the x-axis, thereby providing binding forces against the opening 240 of the electronic module 102.

The electronic module 102 may be secured, along at least one axis, relative to the printed circuit board 104 by first adjusting the securing devices 230, 231, 232, 233 (FIG. 2) along the proximal portion 208 of the electronic module 102 thus allowing the electronic module 102 to maintain a proper mechanical and electrical contact with the printed circuit board 104. Thereafter, the securing devices 250, 252 along the distal portion 210 of the electronic module 102 can be locked in place, at least along one axis, relative to the printed circuit board 104. The distance, for example $d_3$ (FIG. 3) between the distal portion 210 of electronic module 102 and the printed circuit board 104 is variable from unit to unit.

Figure 5:
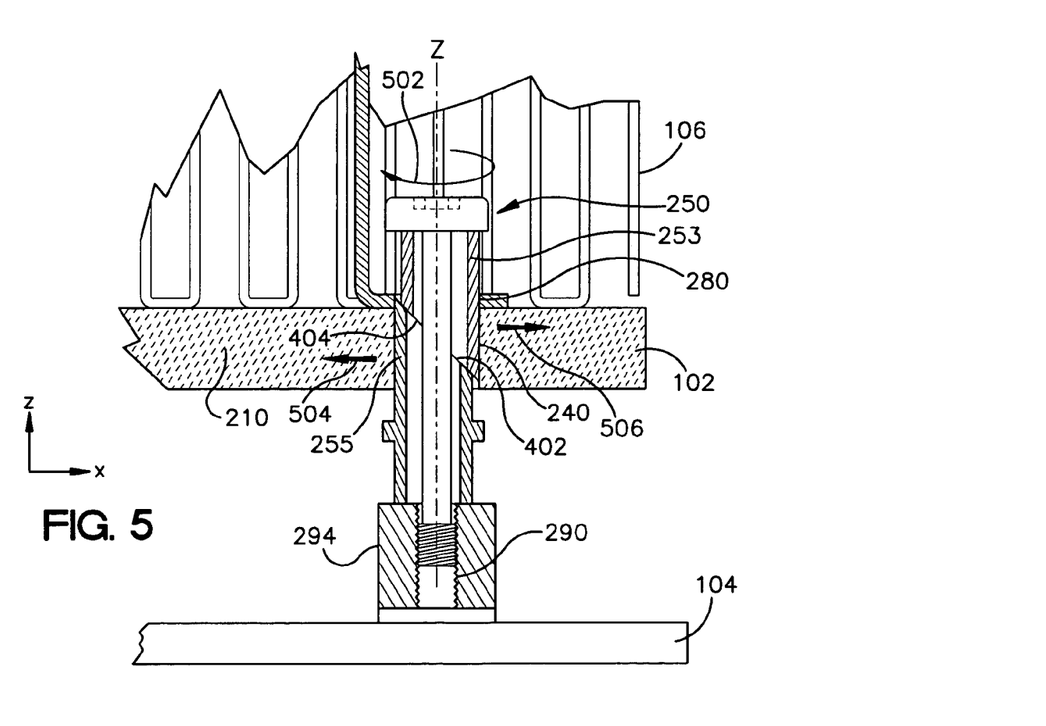
FIG. 5 is cross-sectional view of the securing device of FIG. 4 showing engagement of the securing device with the electronic module, according to an embodiment of the invention.

In FIG. 5 application of torque to the securing device 250 and 252 (FIG. 2) may operate to draw the two wedge portions together resulting in the angled surfaces 402, 404 sliding against one another and, thus, causing sides of the two wedge portions 253, 355 to move laterally in opposite directions, for example, along the x-axis as shown by arrows 504, 506. The amount of torque and the amount of lateral force applied to the securing device can depend upon the angle of the surfaces of the wedge portions. As described above, the first and second wedge portions 253 and 255 have angled surfaces 402, 404 relative to the axis of connection, for example, the z-axis. The angle of the angled surfaces 402, 404 can range from about 90° or less, in an alternative embodiment can range from about 30° to 70° and in an alternative embodiment angle of the wedges 402, 404 can the range from about 40° to 50°, in yet another embodiment the angled surfaces of the wedges 402, 404 can be substantially about 45°.

As the fastener 257 is drawn further in the direction of arrow 502, its head is drawn toward the printed circuit board 104 thereby drawing the wedge portions 253, 255 together. As the distance between securing device 250 and printed circuit board 104 becomes less than the combined lengths of the two wedge portions 253, 255, the angles of interfacing angled surfaces 402, 404 causes lateral movement of the wedge portions 253, 255. Accordingly, as the securing device 250 is tightened, the two wedge portions 253, 255 slip relative to one another along the angled surfaces 402, 404 and expand against the opening 240 of electronic module 102, thereby locking the electronic module 102 in place relative to the printed circuit board 104. The size of the securing device 250 is selected such that at least some portion of the first and second wedge portions 253, 255 are in contact with the opening 240 to thereby grip the wall of the opening 240. In addition, the first wedge portion 253 and the second wedge portion 255 can further include a flat surface adapted to cooperate with the opening 240 of the distal portion so that the angled surfaces 402, 404, of the wedge portions 253, 255, can be positioned in the desired orientation.

In another embodiment, the securing device 250 may be engaged to cause the two wedge portions 253, 255 to slip in relation to one another and overlap within an alternative component of the electronic assembly 100. For example, the two wedge portions 253, 255 can bind against the opening (not shown) of the heat sink 106 to set the position of the electronic module 102 relative to the printed circuit board 104. That is, for example, the interface between the two wedge portions 253, 255 can be disposed within the heat sink 106, within the electronic module 102, or partially within the heat sink 106 and the electronic module 102. In any event, the interface between wedge portions 253, 255, within one of the components of the electronic system 100 can cause a binding force component that is orthogonal to the axis of connection, for example, a force component along the x-axis.

The release of a securing device 250 may be achieved by removing the force that drew the two wedge portions 253, 255 together, for example, as by applying torque to the fastener in a direction opposite to that which was used to draw the wedge portions 253, 255 together. Alternatively a bias force, for example, which can be provided by the use of a spring (not shown) disposed longitudinally within the wedge portions 253, 255, can be used to encourage the wedge portions to be repelled from one another and allowing the angled surfaces 402, 404, of the wedge portions 253, 255 to retract from a binding position.

Figure 6:
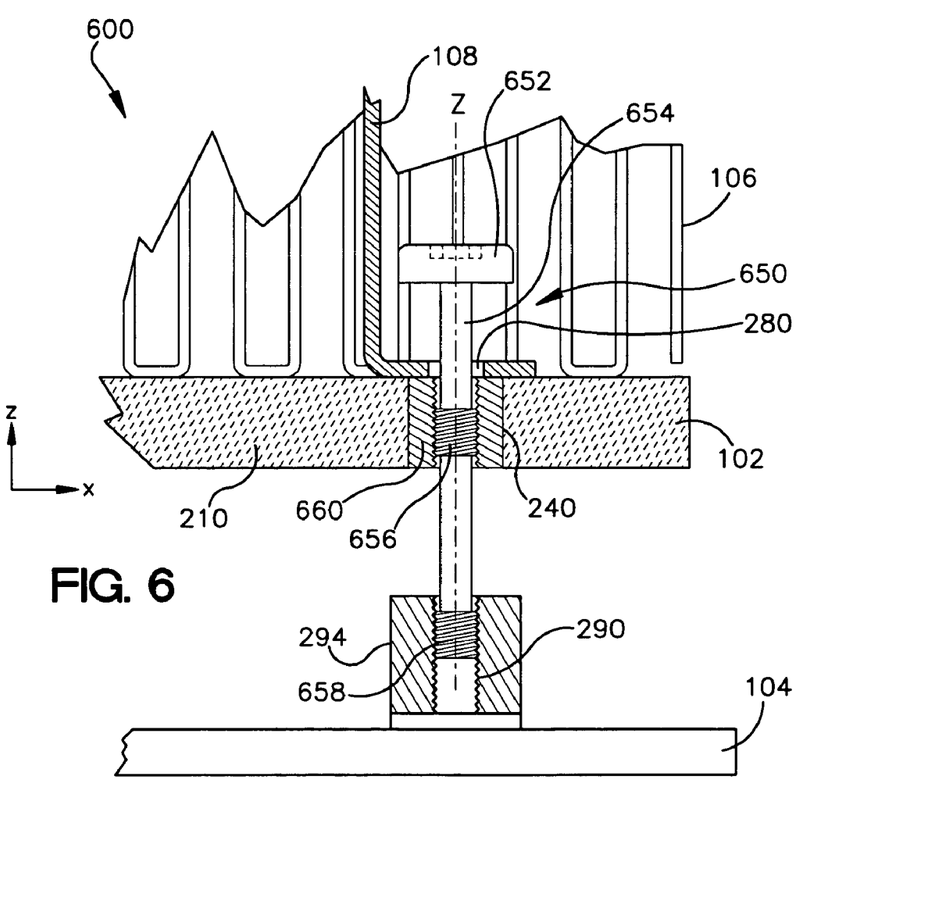
FIG. 6 is a cross-sectional view of a securing device used in the electronic system of FIG. 1 according to an embodiment of the invention.

FIG. 6 illustrates a cross-sectional cut-away portion of an electronic system 600 that includes, for example, a threaded fastener assembly as an alternative securing device. Electronic system 600 includes securing device 650 disposed through tab opening 280 of frame 108 and opening 240 of electronic module 102 to engage receptor 290. Securing device 650 can have one or more threaded portions that secure the position of the distal portion 210 of the electronic module 102 relative to the printed circuit board 104. For example, securing device 650 can include head 652 and cylindrical body 654 which has threaded portions 656, 658. Thread portions 656, 658, can engage threads disposed within opening 240 of electronic module 102 and threads of receptor 290, respectively. The two points of engagement of securing device 650 with electronic module 102 and printed circuit board 104, respectively, can set the electronic module 102 in position along the axis of connection. The deflection of the electronic module along the z-axis can be about one-half (½) or less of the thread pitch. The deflection can vary from unit to unit and can depend upon the type, size and tolerances of the components of the electronic system 100. For example, the deflection of the electronic module 102 relative to the printed circuit board 104 can be less than about 1 millimeter, and in some embodiments less than about 0.5 millimeter, and yet in an another embodiment, can range from about 0.1 to about 0.3 millimeter upon engagement of the threads of opening 240 and receptor 290.

In another embodiment at least one of the two points of engagement can be free floating. For example, threads disposed within opening 240 can be threads of a captive nut 660 that is free to move along an axis, where for example, the diameter of nut 660 is smaller than the diameter of opening 240. This can allow greater tolerances between components of electronic system 600 when inserting or aligning the securing device 650 between nut 660, which is shown captive within electronic module 102, and receptor 290 of the printed circuit board 104. Alternatively, the threads disposed within opening 240 can be integral to the electronic module 102, for example, and can also be present as threads of captive nut 660 disposed within the opening 240 of the electronic module 102. Likewise, the threads of receptor 290 can be integral with the printed circuit board 104, and can also be threads disposed with mounting hardware 294 attached to the printed circuit board 104.

In another embodiment a portion of the securing device 650 that engages with electronic nodule 102 or the printed circuit board 104, or both, may be unthreaded and distal portion 210 of the electronic module 102 may be secured in alternative ways, for example by snap fits.

With reference to FIGS. 3-6, and the example embodiments described above a method for assembling an electronic system, for example the electronic systems 100, 600, includes connecting an electronic module 102 to a circuit board 104, securing a proximal portion 208 of the electronic module 102 to the printed circuit board 104, and securing a distal portion 210 of the electronic module 102 to the printed circuit board 104. The proximal portion 208 of the electronic module 102 can be secured prior to securing the distal portion 210 of the electronic module 102 relative to the printed circuit board 104, as described above. The distal portion 210 of the electronic module 102 can be locked into position along at least one axis, for example, by applying a transverse force to the wall of opening 240 of the electronic module 102. In another example, the distal portion 210 of the electronic module 102 can be secured to the printed circuit board 104 along an axis by engaging threads of the securing device 650 to at least one of the electronic module 102 and the printed circuit board 104. The above example methods for assembling an electronic system 100 are adaptive to variations in the distance and alignment between the electronic module 102 and the printed circuit board 104.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. An electronic system comprising:
   an electronic module in physical communication with a printed circuit board along a connection area, the electronic module comprising a proximal portion that is proximal to the connection area and a distal portion that is distal to the connection area elevated above the printed circuit board;
   a frame configured to align with a heat sink on the electronic module, the frame comprising a proximal portion that is proximal to the connection area and a distal portion that is distal to the connection area;
   at least four first securing devices that extend through a plurality of openings of the proximal portion of the frame and a plurality of openings of the proximal portion of the electronic module to connect the proximal portion of the electronic module to the printed circuit board, wherein the first securing devices are positioned symmetrically around the connection area;
   at least one second securing device that extends through at least one opening of the distal portion of the frame and at least one opening of the distal portion of the electronic module to connect the distal portion of the electronic module to the printed circuit board; and
   wherein the at least one second securing device engages the distal portion of the electronic module relative to the printed circuit board with an application of a transverse force against a wall of the at least one opening of the distal portion of the electronic module.

2. The electronic system of claim 1, wherein at least one of the first and second securing devices comprises threads configured to mate with a receptor of the printed circuit board.

3. The electronic system of claim 1, wherein the at least one second securing device is movable against the wall of the at least one opening of the electronic module upon engagement of one of the at least one second securing device.

4. The electronic system of claim 1, wherein the distal portion of the electronic module and the printed circuit board are connected along an axis, and the at least one second securing device engages the distal portion of the electronic module into a locked position along the axis.

5. The electronic system of claim 1, wherein one of the at least one second securing device that extends through the at least one opening of the distal portion of the electronic module comprises a first wedge portion having an angled surface, a second wedge portion having an angled surface, and a fastener extending through the first wedge portion and the second wedge portion.

6. The electronic system of claim 5, wherein the angled surface of the first wedge portion is interfaced with the angled surface of the second wedge portion when the fastener is in physical communication with the printed circuit board.

7. The electronic system of claim 5, wherein the distal portion of the electronic module and the printed circuit board are connected along an axis, and the angled surface of the first wedge portion and the angled surface of the second wedge portion are oriented at approximately 45° relative to the axis.

8. The electronic system of claim 5, wherein the fastener comprises a threaded portion that engages with a receptor of the printed circuit board and engagement of the fastener causes the first wedge portion and the second wedge portion to slip with respect to one another thereby causing the first wedge portion and the second wedge portion to exert the transverse force against the wall of the at least one opening of the distal portion of the electronic module.

9. The electronic system of claim 5, wherein the at least one second securing device further comprises a flange disposed between the electronic module and the printed circuit board when the at least one second securing device.

10. The electronic system of claim 5, wherein the first wedge portion comprises a flat surface adapted to cooperate with the opening of the distal portion of the electronic device to dispose the angled edge in a desired orientation.

11. The electronic system of claim 1, wherein each of the at least four first securing devices engages the proximal portion of the electronic module into a locked position along an axis that extends between the proximal portion of the electronic module and the printed circuit board.

12. The electronic system of claim 11, wherein at least one of the first and second securing devices comprises threads having a thread pitch and the deflection of the electronic module along the axis upon engagement of the proximal portion of the electronic module into a locked position is about one-half the thread pitch or less.

13. The electronic system of claim 1, further comprising the heat sink disposed on the electronic module.

14. The electronic system of claim 1, wherein the electronic module includes the heat sink.

15. An electronic system comprising:
an electronic module in physical communication with a printed circuit board along a connection area, the electronic module comprising a proximal portion that is proximal to the connection area and a distal portion that is distal to the connection area elevated above the printed circuit board;
a frame configured to align with a heat sink on the electronic module, the frame comprising a proximal portion that is proximal to the connection area and a distal portion that is distal to the connection area;
means for securing the proximal portions of the electronic module and the frame symmetrically around the connection area of the electronic module relative to the printed circuit board; and
means for securing the distal portions of the electronic module and the frame relative to the printed circuit board using a securing device that engages the distal portion of the electronic module by applying a transverse force against a wall of an opening of the distal portion of the electronic module.

16. The electronic system of claim 15, wherein:
the means for securing the proximal portion symmetrically around the connection area of the electronic module comprises a securing device that connects the proximal portion of the electronic module to the printed circuit board along an axis comprises threads comprising a thread pitch; and
the securing device engages the proximal portion of the electronic module into a locked position along the axis such that the deflection of the electronic module along the axis is less than about one-half the thread pitch.

17. The electronic system of claim 16, wherein the securing device engages the distal portion of the electronic module into a locked position along the axis such that the deflection of the electronic module along the axis upon engagement is about 0.5 millimeter or less.

18. The electronic system of claim 15, further comprising the heat sink disposed on the electronic module.

19. The electronic system of claim 15, wherein the electronic module includes the heat sink.

* * * * *